(12) United States Patent
Wortberg

(10) Patent No.: US 11,199,570 B2
(45) Date of Patent: Dec. 14, 2021

(54) METHOD AND DEVICE FOR DETECTING LIGHT ARCS

(71) Applicant: LISA DRÄXLMAIER GMBH, Vilsbiburg (DE)

(72) Inventor: Michael Wortberg, Dorfen (DE)

(73) Assignee: LISA DRAEXLMAIER GMBH, Vilsbiburg (DE)

(*) Notice: Subject to any disclaimer, the term of this patent is extended or adjusted under 35 U.S.C. 154(b) by 114 days.

(21) Appl. No.: 16/746,358

(22) Filed: Jan. 17, 2020

(65) Prior Publication Data

US 2020/0153226 A1 May 14, 2020

Related U.S. Application Data

(63) Continuation of application No. PCT/EP2018/069271, filed on Jul. 16, 2018.

(30) Foreign Application Priority Data

Jul. 17, 2017 (DE) ...................... 10 2017 116 009.4

(51) Int. Cl.
*G01R 31/00* (2006.01)
*G01R 31/58* (2020.01)
(Continued)

(52) U.S. Cl.
CPC ........... *G01R 31/007* (2013.01); *G01R 31/58* (2020.01); *H02H 1/0015* (2013.01); *H02H 3/087* (2013.01); *G01R 31/52* (2020.01)

(58) Field of Classification Search
CPC ...... G01R 31/007; G01R 31/58; G01R 31/52; G01R 31/1272; H02H 1/0015; H02H 3/087
(Continued)

(56) References Cited

U.S. PATENT DOCUMENTS 9,007,068 B2   4/2015   Pushkolli et al.
10,436,830 B2  10/2019  Wortberg et al.
(Continued)

FOREIGN PATENT DOCUMENTS

AU     2016201446     9/2016
DE     102014008494   12/2015
(Continued)

OTHER PUBLICATIONS

International Search Report for International Application PCT/EP2018/069271, dated Oct. 15, 2018.

*Primary Examiner* — Giovanni Astacio-Oquendo
(74) *Attorney, Agent, or Firm* — Burris Law, PLLC

(57) ABSTRACT

A method and a device for detecting arcs includes current values for each component connected to a node being read-in, the node current and the system current determined using the current values, a correlation factor determined for each current value with the node current as quotient from node current and the respective current value, the individual quotients filtered in order to determine a correction factor for each current value, a corrected node-current equation established, wherein each current value is linked to the correction factor previously determined, in order to determine a corrected value of the node evaluation, and finally a trigger threshold is set using the corrected node-current equation.

12 Claims, 9 Drawing Sheets

(51) Int. Cl.
*H02H 1/00* (2006.01)
*H02H 3/087* (2006.01)
*G01R 31/52* (2020.01)

(58) Field of Classification Search
USPC .................................... 324/512, 509, 500
See application file for complete search history.

(56) References Cited

U.S. PATENT DOCUMENTS

| | | | |
|---|---|---|---|
| 2011/0273183 A1* | 11/2011 | Shea | H02H 3/52 324/536 |
| 2015/0269647 A1* | 9/2015 | Jagota | G06Q 30/06 705/26.7 |
| 2015/0346261 A1* | 12/2015 | Chen | H02H 3/16 361/93.6 |
| 2016/0020729 A1* | 1/2016 | Yu | H02S 50/10 324/761.01 |
| 2019/0042935 A1* | 2/2019 | Deisher | G06N 3/063 |
| 2020/0019339 A1* | 1/2020 | Yang | G06F 3/0604 |

FOREIGN PATENT DOCUMENTS

| | | |
|---|---|---|
| DE | 102016009966 | 2/2017 |
| WO | 2001097356 | 12/2001 |

\* cited by examiner

METHOD AND DEVICE FOR DETECTING LIGHT ARCS

CROSS-REFERENCE TO RELATED APPLICATIONS

This application is a continuation of International Application No. PCT/EP2018/069271, filed on Jul. 16, 2018, which claims priority to and the benefit of DE 10 2017 116 009.4, filed on Jul. 17, 2017. The disclosures of the above applications are incorporated herein by reference.

FIELD

The present disclosure relates to a method for detecting arcs as well as a corresponding device for detecting arcs.

BACKGROUND

The statements in this section merely provide background information related to the present disclosure and may not constitute prior art.

The number of power consumers in modern vehicles as well as their power consumption continues to increase. Therefore, vehicles are equipped with a 48 V electrical system that is capable of various consumers (loads) in the vehicle with a higher power with constant current strength. However, the use of 48 V leads to the problem that in the event of damage resulting in a short circuit, stable arcs can form since 48 V lies above the arc ignition voltage. However, the formation of stable arcs occurs not only in 48 V electrical systems in motor vehicles, but also in general in electrical systems that are driven by a voltage above the arc ignition voltage, such as, for example, in the field of E-mobility and the high voltage electrical systems used here, as well as in aircraft, ships, or rail vehicles. Electrical lines in an electrical system are usually protected by fuses. However, since an arc arises in the line as an additional resistance, the short-circuit current is limited such that the fuse is not triggered.

Both serial and parallel arcs generate very high temperatures, with the result that a stable arc can cause significant damage to the vehicle. It is therefore desirable to detect the occurrence of an arc early. However, it is very difficult to distinguish the current limitation by a serial arc from fluctuations of the current draw by the load. In particular, the securing of lines in a 48 V electrical system cannot be effected via fuse, since the current through the fuse is reduced by the arc effect such that the fuse is not triggered. The detection of disturbances (for example, high-resistance short circuits), as arise, for example, with slow wearing down of the line and/or electromigration causes special problems. The short-circuit arc currents are also difficult to detect since they can fall within the load range. On the other hand, the arc power is not so high that the detection can make use of more time.

As a further influencing factor, functional safety is to be considered, which requires a higher availability of connected, safety-relevant consumers. For the future electrical system, increased requirements for the detection of faults in the energy supply thus arise.

Attempting to ensure a 100% availability of the electrical power supply by quality-enhancing measures leads to significant additional costs and does not ultimately lead to functional safety. Faults in the power supply arise today and in principle will arise in the future.

SUMMARY

The present disclosure provides methods to detect arcs in a power network such as, for example, a vehicle electrical system using constructively simple approaches, even with increasing system loads.

The present disclosure is achieved by the subject matter of the independent claims. Advantageous further developments of the present disclosure are specified in the dependent claims, the description, and the accompanying Figures. In particular, the independent claims of a claim category can also be refined in a manner analogous to the dependent claims of another claim category.

In a method for detecting arcs, a current value is read-in for each component connected to a node, and both the node-current and the system current are then determined using the read-in current values. Furthermore, for each read-in current value a correlation factor is determined using the node-current and the respective current values. For this purpose, a quotient is formed from the node-current and the respective current value. These individual quotients for each current value are filtered in order to determine a correction factor for each current value. A corrected node-current equation is subsequently established, wherein each current value is linked with the associated correction factor in order to determine a corrected value of the node evaluation. Via the corrected node-current equation an error space is defined for the node, so that using the corrected node-current equation a trigger threshold can be set for detecting arcs. An arc is detected when the result of the corrected node-current equation lies above the set trigger threshold.

The read-in current values are discrete values for each component connected to the nodes over time. Thus, the node can be a current distributor. Examples of components connected to the nodes are a battery, an electric motor, a control device, a starter-generator, or a further current distributor. The current consumption of the connected components is usually monitored at their input. The current value thus recorded can thus be provided to a higher-level evaluation device. The current value recorded at the component can thus differ from the current provided at the node output, due to line losses or faults. The connected components can thus be electrical sources or consumers, also referred to as load or sink. In the ideal case, the read-in current values for each component are simultaneously recorded. The node-current is defined as the sum of all current values at one time. Without measurement errors or other errors in the system or arc to be detected, the node-current is zero. A node-current deviating from zero corresponds to the sum of all measurement errors of the read-in current values or the sum of all measurement errors plus an arc in the system. The system current is determined as the sum of all absolute values of the current values.

The current values are advantageously read-in continuously over time, determined in each case by the node-current and system current, in order to then determine the correlation factor. The filtering of the quotients that represent the correlation factor can be effected via a temporal low-pass filtering of the first order using a numerical low-pass filter. Here, for example, in terms of time the last 1 second, or last 10 seconds, or even a longer time period can also flow into the low-pass filtering. Generally formulated, the previously determined correlation factor can be filtered using a numerical correlation filter.

With setting of the corrected node-current equation, the correction factor can respectively be subtracted from one and the result multiplied by the corresponding current value.

The result of the node evaluation then corresponds to the sum of the current values offset with the correction factor.

Using the corrected node-current equation an error space can be determined. The error space shows the measuring-error-based deviations of the node-current over the system current. Measuring-error-based deviations now fall within the limits of the error space determined with the corrected node-current equation. The trigger threshold for detecting arcs can now be set at a predefined percentage spaced from the boundary of the corrected error space.

The boundary of the error space and additionally or alternatively the trigger threshold can optionally be stored so that changes therefrom are traceable and evaluable. The boundary of the error space or the trigger threshold can thus be stored when it differs from a last-stored boundary of the error space or trigger threshold. In this way, creeping errors can advantageously be detected. If the boundary shifts despite low-pass filtering and the trigger threshold is thus matched, this indicates a fault, independent of arcs at the nodes, the connected components, or lines connecting these. Additional creeping errors, caused, for example, by aging or corrosion, can thus be detected.

An arc is detected when the result of the corrected node-current equation falls lies above the trigger threshold. Due to the shrinkage of the error space the trigger threshold can be set much lower and relatively small arcs can also be reliably detected despite very high system current.

The inventive idea can also be easily implemented in a device, wherein the device includes apparatuses that are suitable for carrying out steps of the proposed method for detecting arcs. A corresponding device can include microprocessors, FPGAs, ASICs, DSPs, or similar as well as storage in order to execute a variant of the proposed method. In one form, the device comprises an apparatus for reading-in of current values, wherein one current value is read-in per time unit for each component connected to the nodes, an apparatus for determining the node-current and the system current using the read-in current values, an apparatus for determining a correlation factor for each current value associated with a component or of each current curve associated with a component, a filter apparatus for filtering the correlation factors, as well as an apparatus for determining corrected values of a node evaluation based on a corrected node-current equation. In a further apparatus for setting a trigger threshold the trigger threshold for detecting arcs is set using the corrected values of the node evaluation based on the corrected node-current equation.

Further areas of applicability will become apparent from the description provided herein. It should be understood that the description and specific examples are intended for purposes of illustration only and are not intended to limit the scope of the present disclosure.

DRAWINGS

In order that the disclosure may be well understood, there will now be described various forms thereof, given by way of example, reference being made to the accompanying drawings, in which.

The Figures are only schematic depictions and serve only for explanation of the present disclosure. Identical or identically functioning elements are consistently provided with the same reference numbers.

Figure 1:
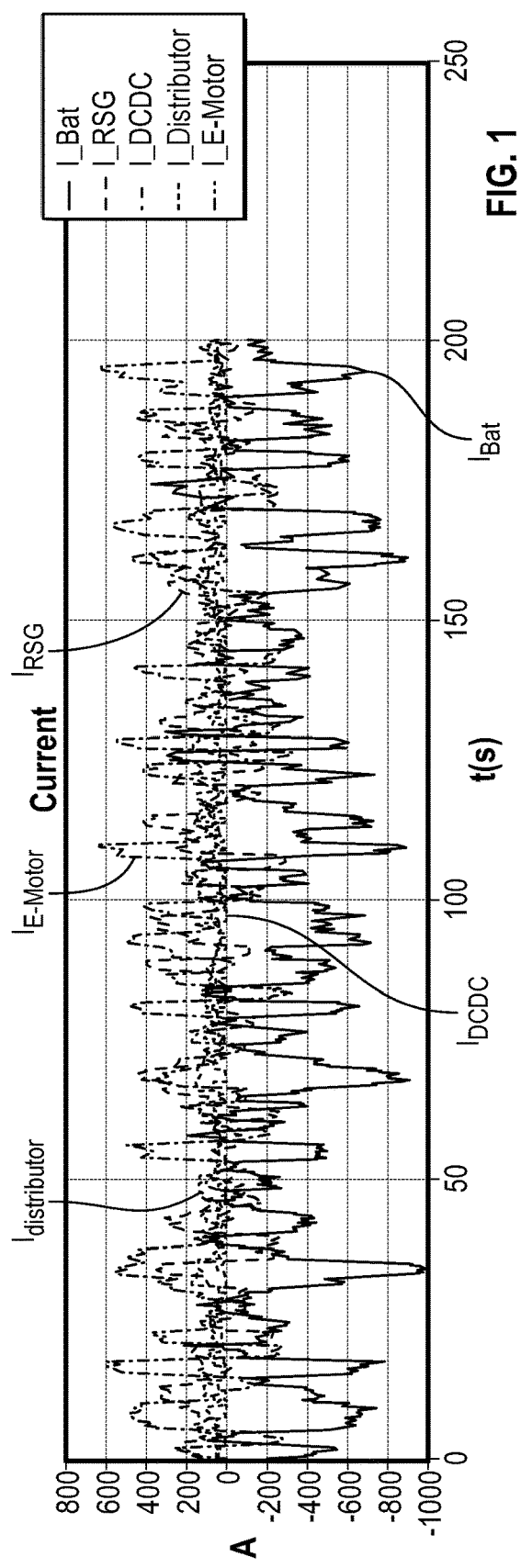
FIG. 1 is a graph of measured currents of a distributor node over time according to an exemplary form of the present disclosure.

The drawings described herein are for illustration purposes only and are not intended to limit the scope of the present disclosure in any way.

DETAILED DESCRIPTION

The following description is merely exemplary in nature and is not intended to limit the present disclosure, application, or uses. It should be understood that throughout the drawings, corresponding reference numerals indicate like or corresponding parts and features.

The present disclosure is described in the following primarily in connection with vehicle electrical systems. However, the present disclosure can be used in any application in which current distributors are used, wherein for all connected loads as well as in the supply line at least one current measurement is performed and arcs can arise, for example, on corresponding switching elements.

In the electrical power supply, unintended faults arise in the connection (source to sink) and fault currents. These basically lead to two basic relationships being violated:

Violation of the node equation: The currents of all currents connected to a (distribution) node should be zero. If the sum of all currents (e.g., battery current minus current of all loads) is not zero, then a fault current against ground or another potential can be inferred.

Violation of the mesh equation: The voltage at the load should be equal to the voltage at the source reduced by the known and permitted resistance of the electrical connection.

If the voltage drop from the source to sink is greater than the load current multiplied by the known impedance of the electrical connection, then a (serial) defect in the connection can be inferred. It is thus possible in principle to detect all connection faults in operation (online) in the electrical system provided measurement data is available with respect to branch currents and voltages (source, load). In practical application, an issue arises in that the voltages and currents in the intelligent sources (e.g., battery, belt-driven starter-generator, DC/DC converter) are measured, but these measurements are faulty and moreover asynchronous. Thus, for example, a DC/DC converter can determine its output current, but only with an accuracy of +/−5%. With the aging of the component the error can additionally increase to +/−10%. Since a large number of loads can be connected to a supply node (for example, to the battery), the errors of the individual loads can be constructively added. Even without fault current (no short circuit or arc to ground) the node evaluation ΣI=Idc, caused by the measurement errors, already results in a very large value for the node-current Idc. Without measurement error, ΣI=Idc=0.

If the measured values of the loads connected to the distributor node are sent to an evaluation unit, then the node-current Idc can be determined in the evaluation unit, for example:

$$Idc = I_1 + I_2 + I_3 + I_4 + I_5 + \ldots + I_n$$

$$Idc = I_1[m] + I_2[m] + I_3[m] + I_4[m] + I_5[m] + \ldots + I_n[m]$$

$$Idc = I_{Bat\_com}[m] + I_{RSG\_com}[m] + I_{DCDC\_com}[m] + I_{E\text{-}Mot\_com}[m] + I_{Vert\_com}[m] + \ldots + I_n[m]$$

Furthermore, the total system current Is is determined. This is the sum of the absolute values of all currents of the distributor node:

$$Is = |I_1| + |I_2| + |I_3| + |I_4| + |I_5| + \ldots + |I_n|$$

$$Is = |I_1[m]| + |I_2[m]| + |I_3[m]| + |I_4[m]| + |I_5[m]| + \ldots + |I_n[m]|$$

$$Is = |I_{Bat\_com}[m]| + |I_{RSG\_com}[m]| + |I_{DCDC\_com}[m]| + |I_{E\text{-}Mot\_com}[m]| + |I_{Vert\_com}[m]| + \ldots + |I_n[m]|$$

If the measurement errors are proportional to the size of the measured values, it is clear that the higher the system current is, the higher the expected value for the node-current Idc as an imbalance in the node evaluation caused by measurement errors.

Figure 2:
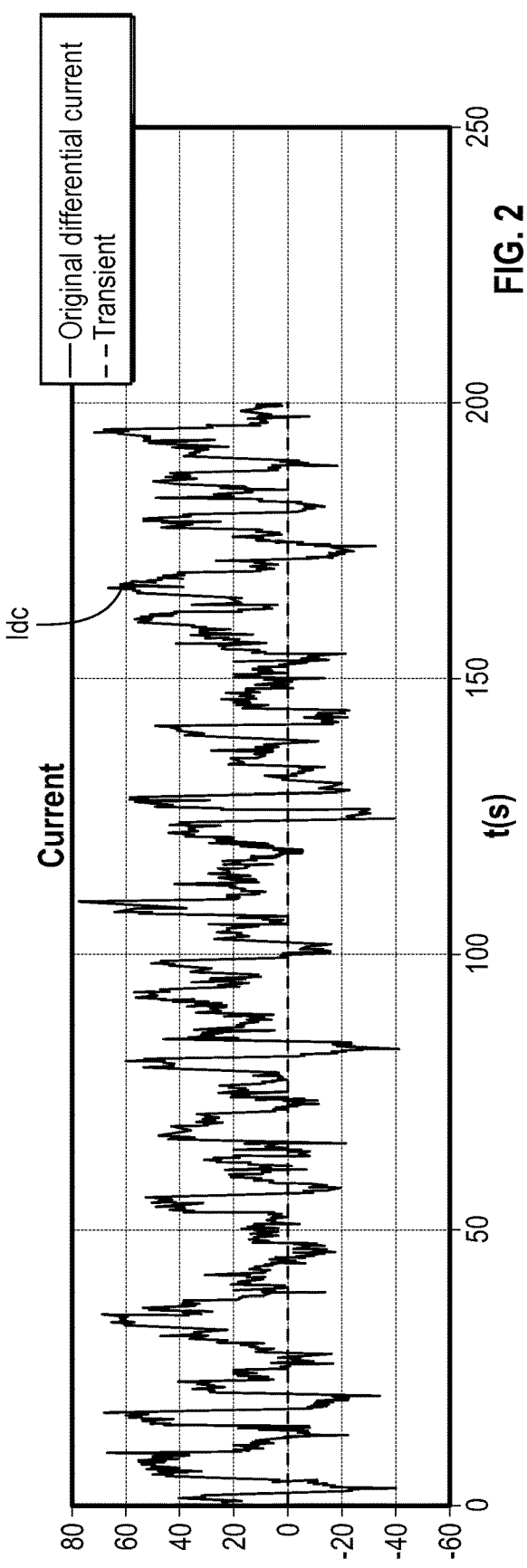
FIG. 2 is a graph of a node-current over time, i.e., the sum of the measured currents depicted in FIG. 1, according to an exemplary form of the present disclosure.

FIG. 1 shows measured currents of a distributor node in a Cartesian coordinate system. The time t is represented in seconds on the abscissa, and the current in amperes [A] on the ordinate. For example, four loads (current value of a starter-generator $I_{RSG\_com}$; current value of a DC/DC converter $I_{DCDC\_com}$; current value of an electric motor $I_{E\text{-}Mot\_com}$; current value of a current distributor $I_{Vert\_com}$) and a source (current value of a battery $I_{Bat\_com}$) are represented. In FIG. 2 the sum of the current values of the five components at the nodes is then correspondingly depicted over time:

$$Idc = I_1 + I_2 + I_3 + I_4 + I_5 = I_{Bat\_com} + I_{RSG\_com} + I_{DCDC\_com} + I_{E\text{-}Mot\_com} + I_{Vert\_com}$$

FIG. 2 thus shows the node current Idc over time.

Due to the measurement errors of all connected loads and sources a significant value results for the node-current Idc. In a fault space 300 the node-current Idc can be plotted against the system current Is. If the evaluation is made over a large number of combinations of measured values, then a state space of the measurement error stands out.

Figure 3:
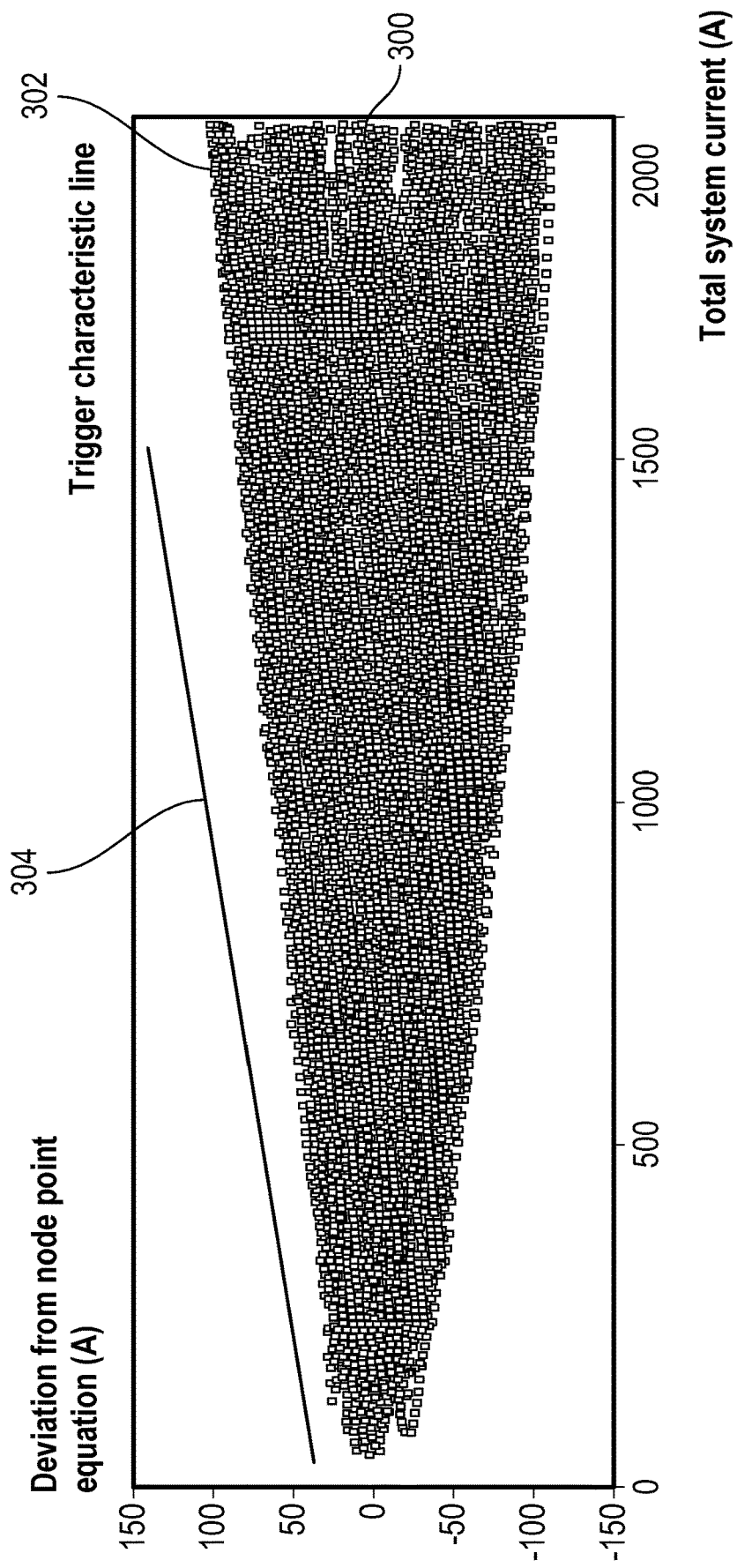
FIG. 3 is a graph of a fault space based on the currents depicted in FIG. 1 of a distributor node.

The node-current depicted in FIG. 2 is plotted in FIG. 3 over the system current Is. Thus, in a Cartesian coordinate system the system current Is is plotted on the abscissa and the node-current Idc is plotted on the ordinate, in each case in [A]. Here a fault space 300 results with corresponding limits 302 of the fault space 300. A trigger threshold 304 is defined for the limit 302 with a certain distance that is selected either absolutely or proportionally with respect to the limit 302.

The trigger characteristic curve 304 for detecting a fault current (arc, short circuit) must fall outside the fault space 300 since false triggering can otherwise result. It can be seen that due to the measurement errors only very large fault currents 410 can be detected. The more loads that are connected to the nodes and the more imprecise the measured values and the higher the total system current is, the "more blind" the detection becomes.

Figure 4:
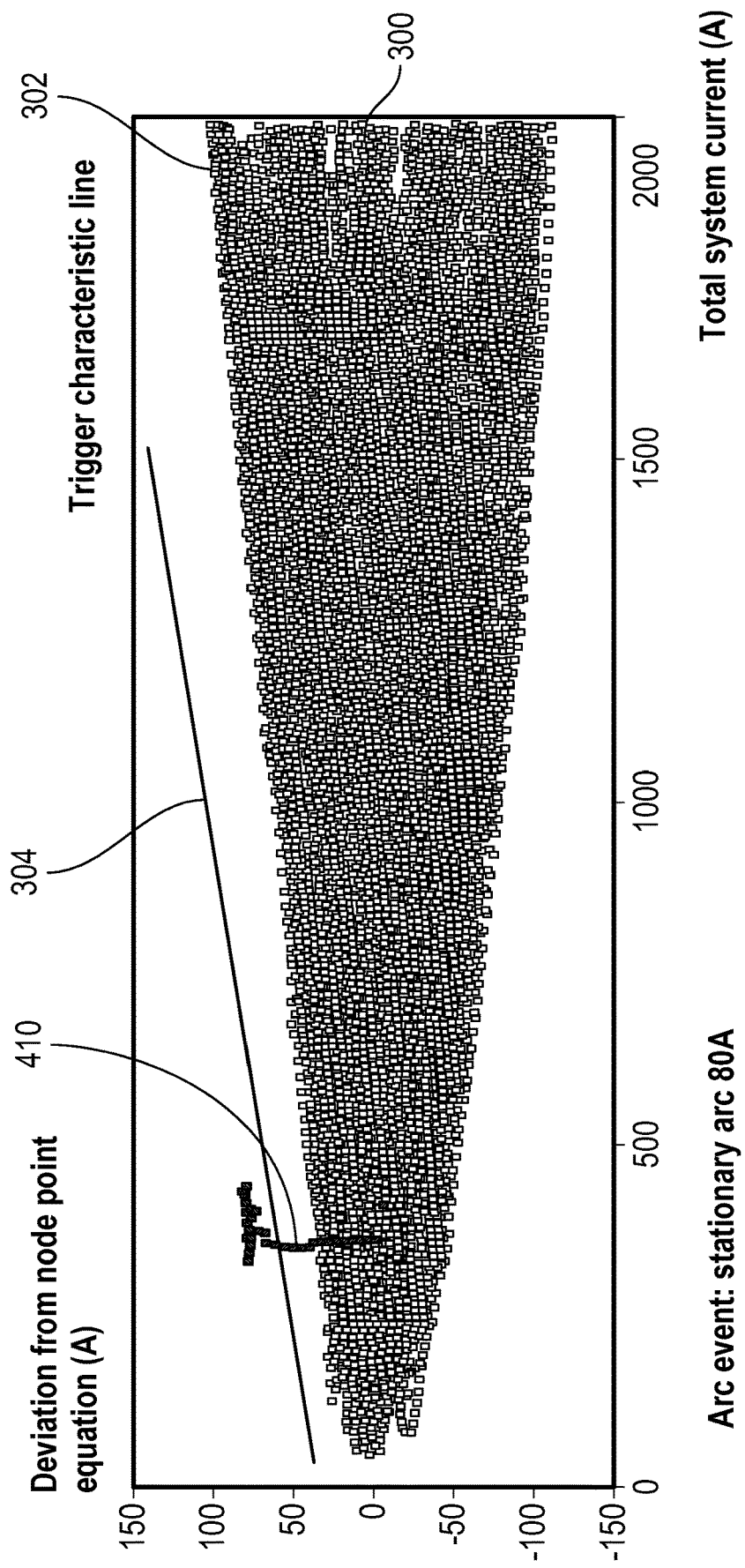
FIG. 4 is a graph of an arc event based on the currents depicted in FIG. 1 of a distributor node.

FIG. 4 shows the fault space 300 and the trigger curve 304 according to the illustration in FIG. 3. In addition, a stationary arc event with 80 A to 1000 J is depicted as fault current 410. Since at the time of the fault current 410 the total system current is approximately 300 A, the fault space is still relatively small and the fault current 410 exceeds the trigger characteristic curve 304. The fault current 410 is thus detected. The fault occurs when the system current is (coincidentally) very small. The node-current Idc based on the measurement error plus the proportion caused by the arc leads to a "rupture" of the trigger characteristic curve 304. The fault is thus detected.

Figure 5:
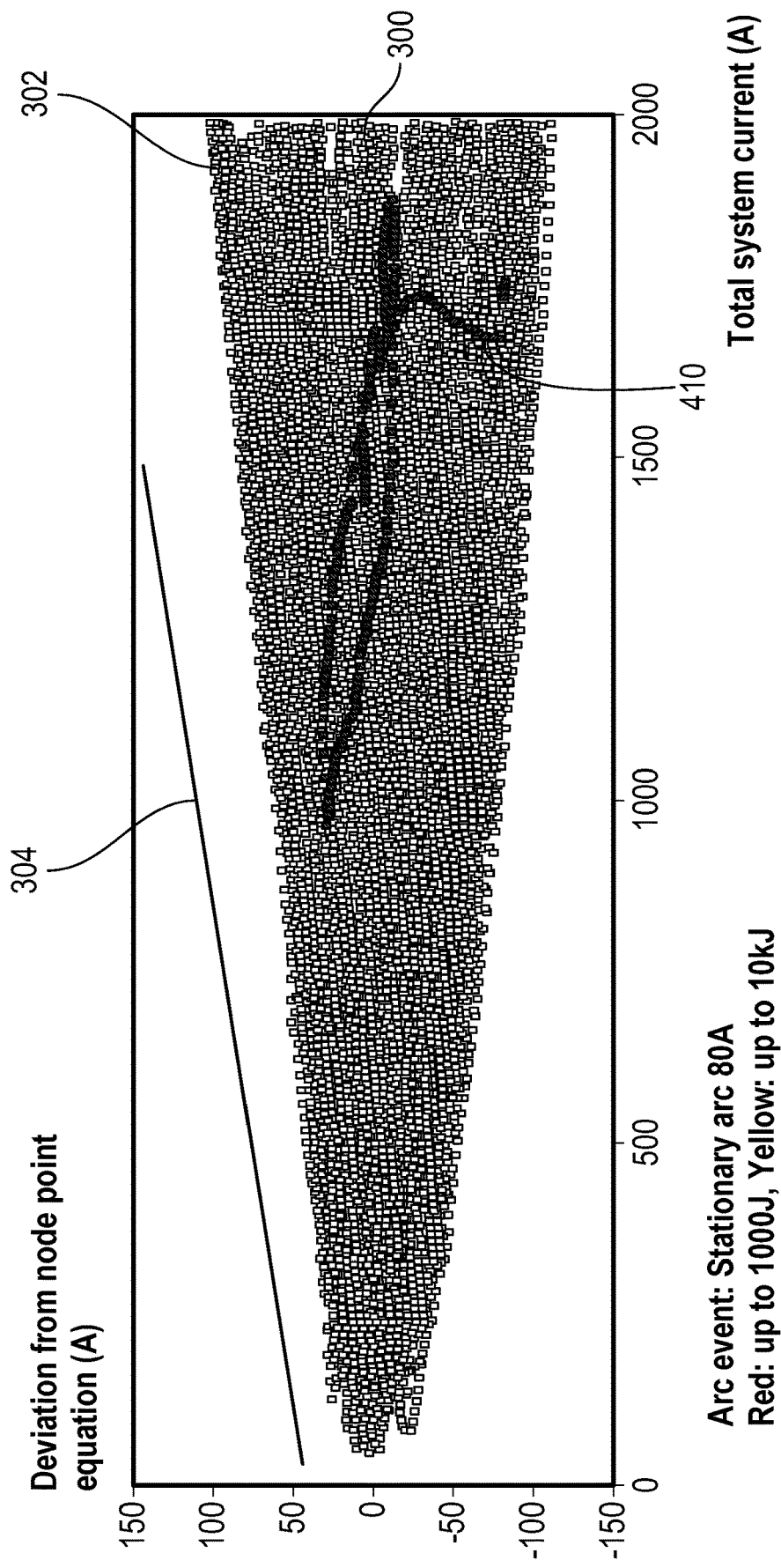
FIG. 5 is graph of another arc event based on the currents depicted in FIG. 1 of a distributor node.

The situation is different in the example depicted in FIG. 5, where the fault current 410 is a stationary arc event with 80 A to 1000 J. However, since this occurs with a total system current Is of approximately 1700 A, the fault space 300 is larger and the fault current 410 remains below the trigger characteristic curve 304. The parallel arc occurs with a large system current Is and a predominantly negative measurement fault. The arc goes "under" in the fault space 300 and cannot be detected. This shows an outcome of the present disclosure, to limit the fault space in order to increase the sensitivity of the fault detection.

The value of the node-current Idc corresponds to the sum of all measurement errors. Each individual measurement error (as part of the node-current Idc, if the node-current Idc could be resolved into its components) would correlate with its measured values. In the following, the running correlation of Idc(t) is determined with all measured values $I_{DCDC\_com}$, $I_{RSG\_com}$, among others. For this purpose, the quotient of Idc is first determined with each individual measured value [m] or each time slice dt. $MFc_X$ thus makes a statement about the proportion of the total fault Idc with respect to the individual measured value. (Four values here by way of example):

$$MFc_{Bat} = Idc/I_{Bat\_com}[m]$$

$$MFc_{RSG} = Idc/I_{RSG\_com}[m]$$

$$MFc_{E\text{-}Motor} = Idc/I_{E\text{-}Motor\_com}[m]$$

$$MFc_{Vert} = Idc/I_{Vert\_com}[m]$$

Hereinafter a temporal low-pass filtering of the first order occurs through a numerical low-pass filter. If, for example the battery current $I_{Bat\_com}$ does not correlate with the node-current Idc, then the value is averaged and a small correction factor $c_{Bat}$ results. However, if the value correlates, then a correction factor $c_{Bat}$ results that represents a direct measure for the measurement error of the current measurement in the battery. The inventive solution uses a learning algorithm that can set to adjust to different and (slowly) changing measurement errors, for example, due to aging.

$$c_{Bat}[m+1] = \frac{(c_{Bat}[m] * tcm1) + MFc_{Bat}}{tc}$$

$$c_{RSG}[m+1] = \frac{(c_{RSG}[m] * tcm1) + MFc_{RSG}}{tc}$$

$$c_{E\text{-}Motor}[m+1] = \frac{(C_{E\text{-}Motor}[m] * tcm1) + MFc_{E\text{-}Motor}}{tc}$$

$$c_{Vert}[m+1] = \frac{(c_{Vert}[m] * tcm1) + MFc_{Vert}}{tc}$$

tc is set in the exponential smoothing (low-pass) in differential notation typically with 60 s/dt, and tcm1 with (60 s/dt−1).

Figure 6:
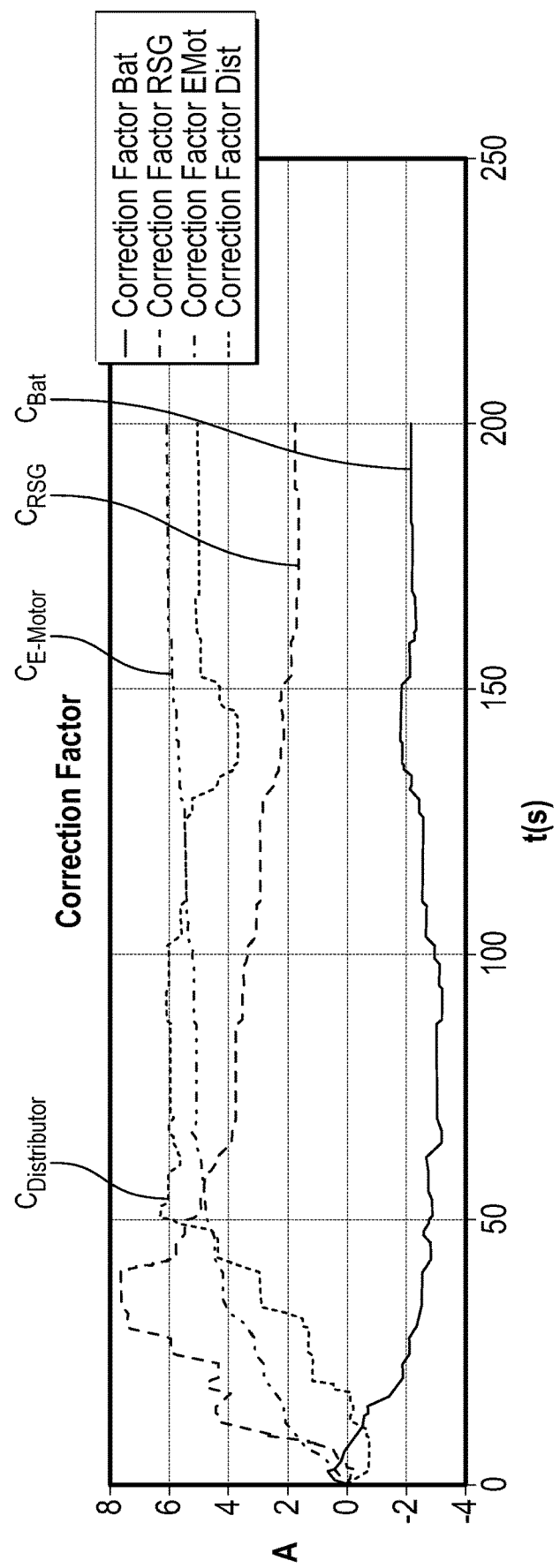
FIG. 6 is a graph of a comparison of the node-current depicted in FIG. 2 with a corrected node-current according to an exemplary form of the present disclosure.

FIG. 6 shows the correction factors $c_{Bat}$, $c_{RSG}$, $c_{E-Motor}$, $c_{Vert}$ over time, used on the currents depicted in FIG. 1 of a distributor node.

The correction factors thus determined are used for the node equation with the factor$_{(1-cXX[m])}$:

$$Idi = I_1 \times (1-c_1[m]) + I_2 \times (1-c_2[m]) + I_3 \times (1-c_3[m]) + \ldots + I_n \times (1-c_n[m])$$

$$Idi = I_1[m] \times (1-c_1[m]) + I_2[m] \times (1-c_2[m]) + \ldots + I_n[m] \times (1-c_n[m])$$

$$Idi = I_{Bat\_com}[m] \times (1-c_{Bat}[m]) + I_{RSG\_com}[m] \times (1-c_{RSG}[m]) + I_{DCDC\_com}[m] \times (1-c_{DCDC}[m]) + I_{E-Mot\_com}[m] \times (1-c_{E-Motor}[m]) + I_{Vert\_com}[m] + (1-c_{Vert}[m]) + \ldots + I_n[m] \times (1-c_n[m])$$

Figure 7:
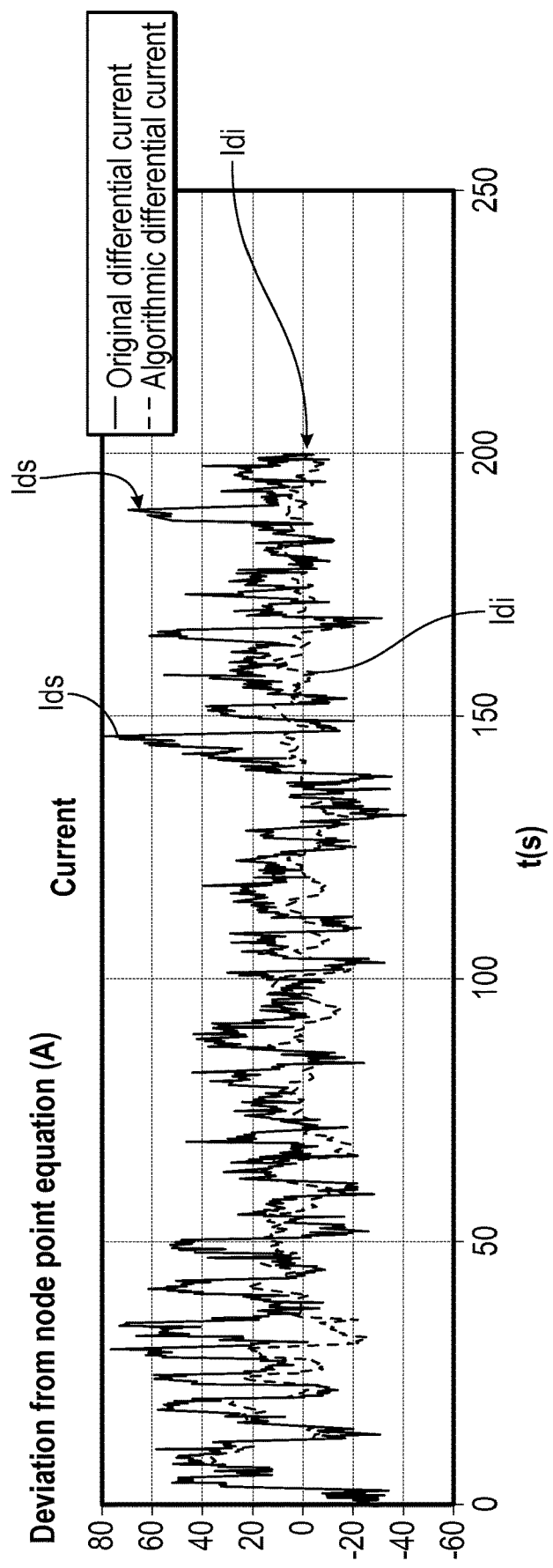
FIG. 7 is an illustration of the convergence of the correction factors determined continuously via the proposed method according to an exemplary form of the present disclosure.

Idi thus represents the result of the corrected node evaluation. FIG. 7 shows in a Cartesian coordinate system the time in seconds [s] on the abscissa, and the deviation from the node-current equation in amperes [A] on the ordinate. The diagram shows the node-current Idc as an original node error due to measurement errors and "jitter" as well as the corrected node-current Idi as a converging node error signal with inclusion of calculated measurement accuracy of the channels. It can be seen how the node-current Idc becomes increasingly smaller with the correlation filter, i.e., the corrected node-current Idi. After approximately 150 s the values for the measurement errors of the individual loads have converged. If large loads are present larger initial errors arise and the algorithm converges more quickly.

Figure 8:
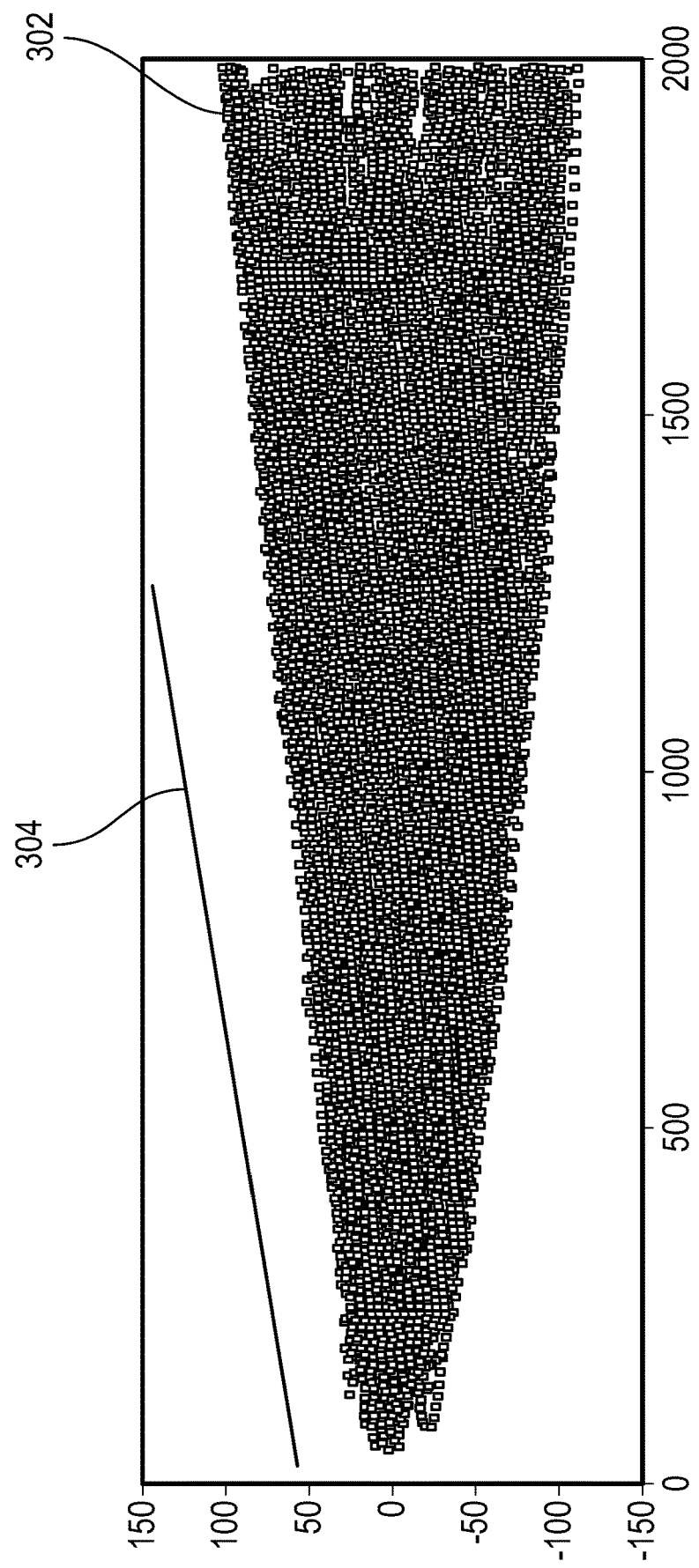
FIG. 8 is an illustration of a fault space according to FIG. 3.
Figure 9:
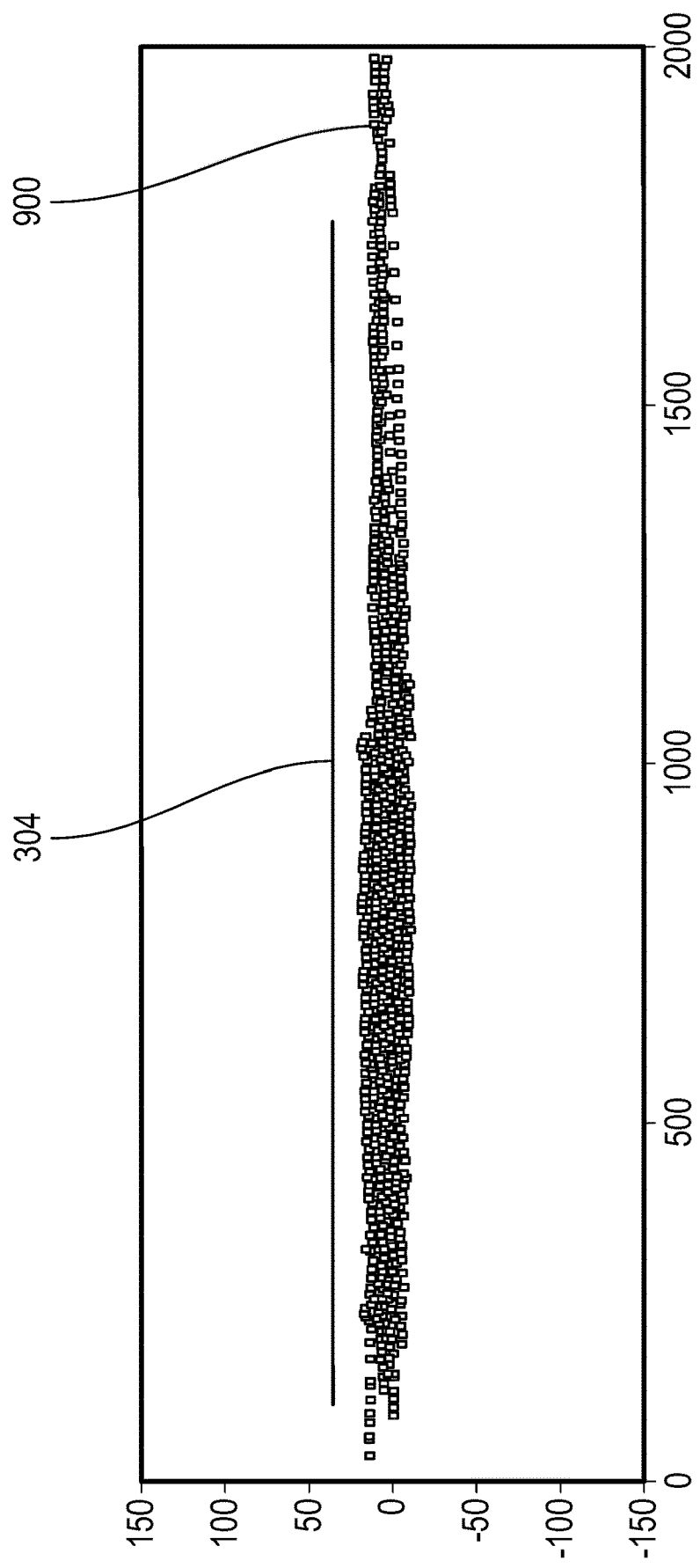
FIG. 9 is an illustration of a corrected fault space according to an exemplary form of the present disclosure.

FIG. 8 and FIG. 9 contrast the fault space 300 without and the corrected fault space 900 with the described correlation function. Using the "learning" correlation function it is possible to significantly reduce the fault space. It is clear that the trigger threshold 304 can be lowered significantly. In this example the algorithm is set such that the learning process only starts when the node-current Idc becomes greater than 50 A.

The learning algorithm also adapts to the fault current itself. However, this is furthermore recognized as such since:

The algorithm adapts only slowly, and sudden faults thus impact non-changing trigger thresholds in the active time of the fault.

A maximum limit for the adapting is specified, for example +/−10%

Furthermore, it is very useful to communicate the learned limits 302 of the fault space 300 into storage or a cloud storage when changes are made. Here a higher-level evaluation on potential, creeping faults or preventive maintenance can be initiated.

This present disclosure shows the use of state spaces and the use of simple numerical correlation filters for the learning compensation of measurement errors.

To more easily understand, in the following description the reference numbers are maintained as reference with respect to the preceding Figures.

Figure 10:
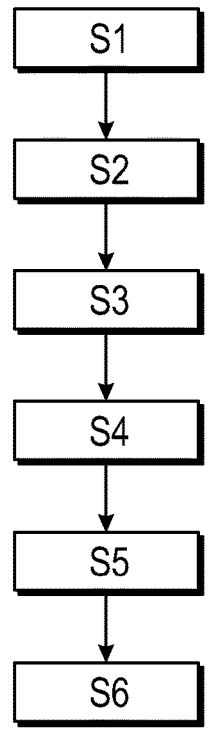
FIG. 10 is a flow diagram of a method for detecting arcs according to an exemplary form of the present disclosure.

FIG. 10 shows a flowchart of a method for detecting arcs. The method comprises a step S1 of reading-in of a current value $I_1, I_2, I_3, I_4, I_5, \ldots I_n$ on each component $504_1, 504_2, 504_3, 504_4, 504_5, \ldots 504_n$ connected to a current distributor/node, a step S2 of determining the node-current Idc and the system current Is using the current values $I_1, I_2, I_3, I_4, I_5, \ldots I_n$, a step S3 of determining a correlation factor for each current value $I_1, I_2, I_3, I_4, I_5, \ldots I_n$ with the node-current Idc as quotient $MFc_1$, $MFc_2$, $MFc_3$, $MFc_4$, $MFc_5, \ldots MFc_n$ from node-current Idc and the respective current value $I_1, I_2, I_3, I_4, I_5, \ldots I_n$, a step S4 of filtering the individual quotients $MFc_1$, $MFc_2$, $MFc_3$, $MFc_4$, $MFc_5, \ldots MFc_n$ in order to determine a correction factor $c_1, c_2, c_3, c_4, c_5, \ldots c_n$ for each current value $I_1, I_2, I_3, I_4, I_5, \ldots I_n$, a step S5 of establishing a corrected node-current equation, wherein each current value $I_1, I_2, I_3, I_4, I_5, \ldots I_n$ In is linked to the correction factor $c_1, c_2, c_3, c_4, c_5, \ldots c_n$ determined in step S4 in order to determine a corrected value Idi of the node evaluation, as well as a step S6 of setting a trigger threshold using the corrected node-current equation.

Figure 11:
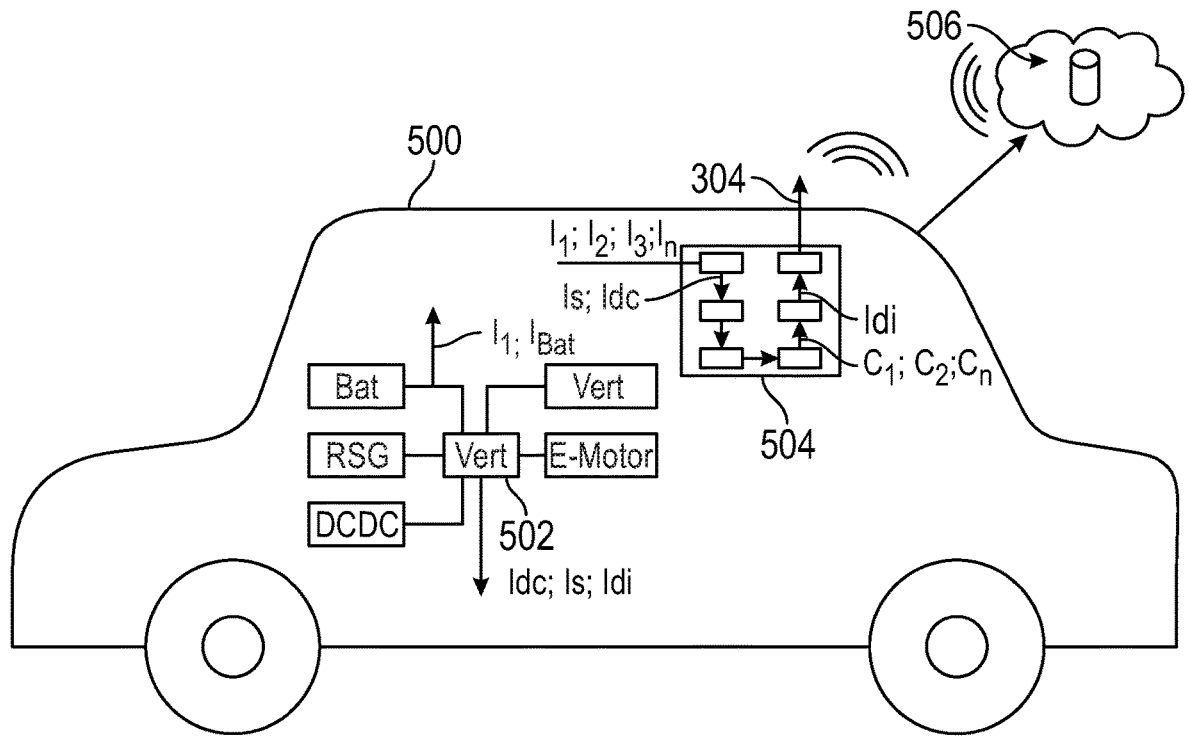
FIG. 11 is a block diagram of a device for detecting arcs according to an exemplary form of the present disclosure.

FIG. 11 shows a vehicle 500 including a current distributor 502. A battery Bat, a starter-generator RSG, a DC/DC converter DCDC, an electric motor E-Motor, and a further distributor Vert are connected to the current distributor 502. A device 506 for detecting arcs is provided in the vehicle 500. The device 506 includes apparatuses to carry out the method described in FIG. 10 or the method steps described there in the corresponding apparatuses. The components depicted here by way of example battery Bat, starter-generator RSG, DC/DC converter DCDC, electric motor E-Motor as well as further distributor Vert are configured to monitor the momentary flowing current and communicate the corresponding current value or current value $I_{Bat\_com}$, $I_{RSG\_com}$, $I_{DCDC\_com}$, $I_{E-Mot\_com}$, $I_{Vert\_com}$ to the device 506.

The device 506 optionally includes a communication apparatus in order to transmit a changed trigger characteristic curve 304, changed limits 302 of the fault space 300 or new correction factors $c_1, c_2, c_3, c_4, c_5, \ldots c_n$ to a corresponding storage, such as, for example, a cloud 508. These data can thus be monitored and further evaluated for predictive diagnosis. A corresponding storing can be effected in the vehicle and the data can be evaluated in a vehicle-dependent manner or evaluated decentrally for a variety of vehicles, whereby an evaluation over a number of vehicles can also be effected in order to carry out further evaluations using data mining tools.

Since the above-described devices and methods described in detail are examples, they can be modified in a conventional manner by the person skilled in the art to a wide extent without leaving the field of the present disclosure. In particular, the mechanical assemblies and the size ratios of the individual elements with respect to one another are only exemplary.

Unless otherwise expressly indicated herein, all numerical values indicating mechanical/thermal properties, compositional percentages, dimensions and/or tolerances, or other characteristics are to be understood as modified by the word "about" or "approximately" in describing the scope of the present disclosure. This modification is desired for various reasons including industrial practice; material, manufacturing, and assembly tolerances; and testing capability.

As used herein, the phrase at least one of A, B, and C should be construed to mean a logical (A OR B OR C), using a non-exclusive logical OR, and should not be construed to mean "at least one of A, at least one of B, and at least one of C."

The description of the disclosure is merely exemplary in nature and, thus, variations that do not depart from the substance of the disclosure are intended to be within the scope of the disclosure. Such variations are not to be regarded as a departure from the spirit and scope of the disclosure.

What is claimed is:

1. A method for detecting arcs comprising:
reading-in a current value for each component connected to a node;
determining a node-current and a system current using the current value;
determining a correlation factor for each current value with the node-current as a quotient of the node-current and a respective current value;
filtering the quotient in order to determine a correction factor for each current value;
establishing a corrected node-current equation, wherein each current value is linked to the correction factor, in order to determine a corrected value of a node evaluation; and
setting of a trigger threshold using the corrected node-current equation.

2. The method according to claim 1, wherein the node-current is determined as a sum of all current values and the system current is determined as a sum of all absolute values of the current values.

3. The method according to claim 1, wherein a temporal low-pass filtering of a first order occurs in order to determine the correction factor for each current value.

4. The method according to claim 1, wherein when establishing the corrected node-current equation, each respective correction factor is subtracted from a value of one and then multiplied by an associated current value, wherein the corrected value of the node evaluation is a sum of the currents.

5. The method according to claim 1, wherein when setting of the trigger threshold using the corrected node-current equation, a corrected fault space is determined, and the trigger threshold is set as a predefined percentage spaced from a limit of the corrected fault space.

6. The method according to claim 5 further comprising storing the limit of the corrected fault space when it differs from a previously stored limit of the fault space.

7. The method according to claim 6 further comprising evaluating the stored limits of the fault space over time in order to diagnose creeping errors.

8. The method according to claim 1, wherein an alternative numerical correlation filter is used when filtering the quotient.

9. The method according to claim 1, further comprising detecting an arc when at least one of the system current and a result of the corrected node evaluation is greater than the trigger threshold.

10. A device for detecting an arc comprising:
an apparatus for reading-in a current value for each component connected to a node;
an apparatus for determining a node-current and a system current using the current value;
an apparatus for determining a correlation factor for each current value with the node-current as a quotient of the node-current and a respective current value;
an apparatus for filtering the quotient in order to determine a correction factor for each current value;
an apparatus for establishing a corrected node-current equation, wherein each current value is linked to the correction factor, in order to determine a corrected value of a node evaluation; and
an apparatus for setting of a trigger threshold using the corrected node-current equation.

11. The device according to claim 10, wherein the device is selected from the group consisting of microprocessors, FPGAs, ASICs, and DSPs.

12. The device according to claim 11 further comprising memory.

* * * * *